US010330458B2

(12) United States Patent
Haight et al.

(10) Patent No.: US 10,330,458 B2
(45) Date of Patent: Jun. 25, 2019

(54) HEIGHT MEASUREMENT USING OPTICAL INTERFERENCE (71) Applicant: INTERNATIONAL BUSINESS MACHINES CORPORATION, Armonk, NY (US)

(72) Inventors: Richard A. Haight, Mahopac, NY (US); James B. Hannon, Lake Lincolndale, NY (US); Rudolf M. Tromp, North Salem, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/110,626

(22) Filed: Aug. 23, 2018

(65) Prior Publication Data
US 2018/0364023 A1   Dec. 20, 2018

Related U.S. Application Data (60) Division of application No. 15/480,735, filed on Apr. 6, 2017, which is a continuation of application No. 15/093,198, filed on Apr. 7, 2016, now Pat. No. 9,752,865.

(51) Int. Cl.
*G01B 11/02*   (2006.01)
*G01B 9/02*   (2006.01)
*G01B 11/14*   (2006.01)
*G03F 7/20*   (2006.01)
*G01B 11/06*   (2006.01)

(52) U.S. Cl.
CPC .............. *G01B 9/02* (2013.01); *G01B 11/026* (2013.01); *G01B 11/0608* (2013.01); *G01B 11/14* (2013.01); *G03F 7/70775* (2013.01)

(58) Field of Classification Search
CPC .... G01B 9/02; G01B 11/002; G01B 11/2441; G01B 11/02; G03F 7/0775
USPC .......................................... 356/498
See application file for complete search history.

(56) References Cited

U.S. PATENT DOCUMENTS

| 3,359,851 | A |   | 12/1967 | Lipschutz et al. |
| 4,172,663 | A | * | 10/1979 | Byer .......... G01J 9/02 356/454 |
| 5,398,113 | A |   | 3/1995 | de Groot |
| 6,014,216 | A |   | 1/2000 | Zorabedian |
| 6,034,774 | A |   | 3/2000 | Marcus et al. |
| 7,177,029 | B2 |   | 2/2007 | de Groot |
| 8,908,154 | B2 |   | 12/2014 | Bridges et al. |

(Continued)

OTHER PUBLICATIONS

List of IBM Patents or Patent Applications Treated as Related dated Aug. 23, 2018, 2 pages.

*Primary Examiner* — Md M Rahman
(74) *Attorney, Agent, or Firm* — Tutunjian & Bitetto, P.C.; Vazken Alexanian (57) ABSTRACT Systems for measuring a distance include a lens positioned a distance above a target surface. A camera is configured to measure a first interference pattern between the lens and the target surface using a light source at a first wavelength and to measure a second interference pattern between the lens and the target surface using a light source at a second wavelength. A processor is configured to determine an absolute measurement of the distance between the lens and the target surface based on the first interference pattern and the second interference pattern.

20 Claims, 4 Drawing Sheets (56) References Cited

U.S. PATENT DOCUMENTS

| | | | |
|---|---|---|---|
| 2004/0028091 A1* | 2/2004 | Baev | H01S 3/067 |
| | | | 372/6 |
| 2011/0304856 A1* | 12/2011 | Ge | G01B 11/2441 |
| | | | 356/511 |
| 2013/0070256 A1* | 3/2013 | Tokimitsu | G01B 9/02004 |
| | | | 356/498 |
| 2014/0028864 A1* | 1/2014 | Tsubusaki | H04N 5/23245 |
| | | | 348/208.12 |
| 2015/0176973 A1 | 6/2015 | Tang et al. | |
| 2016/0195608 A1* | 7/2016 | Ruenz | G01S 7/411 |
| | | | 342/89 |

* cited by examiner

HEIGHT MEASUREMENT USING OPTICAL INTERFERENCE

BACKGROUND

Technical Field

The present invention relates to height measurement at small distances and, in particular, to the use of optical interference to determine absolute vertical position above a surface.

Description of the Related Art

Optical interference can provide a precise measurement of a change in distance between a lens surface and a target surface. However, interference patterns (e.g., Newton's rings) are typically periodic, repeating their pattern with height changes on the order of the wavelength of the light used. Measuring absolute distances between the lens and the target surface is therefore difficult.

SUMMARY

A system for measuring a distance includes a lens positioned a distance above a target surface. A camera is configured to measure a first interference pattern between the lens and the target surface using a light source at a first wavelength and to measure a second interference pattern between the lens and the target surface using a light source at a second wavelength. A processor is configured to determine an absolute measurement of the distance between the lens and the target surface based on the first interference pattern and the second interference pattern.

A system for measuring a distance includes a lens positioned a distance above a target surface. A camera is configured to measure a first interference pattern between the lens and the target surface using a light source at a first wavelength and to measure a second interference pattern between the lens and the target surface using a light source at a second wavelength, different from the first wavelength, by measuring a radius of a smallest ring in the second interference pattern. A processor is configured to determine an absolute measurement of the distance between the lens and the target surface based on the first interference pattern and the second interference pattern.

A system for measuring a distance includes a spherical lens positioned a distance, within a maximum measurement distance, above a target surface. A camera is configured to measure a first interference pattern between the spherical lens and the target surface using a laser at a first wavelength, by measuring a radius of a smallest ring in the first interference pattern, and to measure a second interference pattern between the spherical lens and the target surface using a laser at a second wavelength, different from the first wavelength, by measuring a radius of a smallest ring in the second interference pattern. A processor is configured to determine an absolute measurement of the distance between the spherical lens and the target surface based on the radius of the smallest ring of the first interference pattern and the radius of the smallest ring of the second interference pattern.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention provide absolute position measurement of a lens surface above a target surface by employing multiple different wavelengths. Although each wavelength is periodic over distances on the order of their wavelength (e.g., in the hundreds of nanometers), measuring multiple interference patterns at different wavelengths provides a much longer period, making absolute position measurement feasible.

Figure 1:
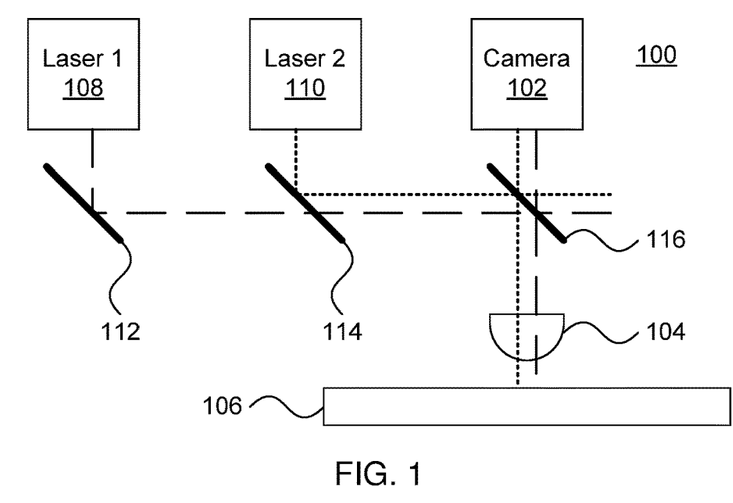
FIG. 1 is a block diagram of a distance measuring apparatus in accordance with the present principles.

Referring now to FIG. 1, a distance sensing apparatus 100 is shown. A camera 102 captures a set of interference patterns reflected by a target surface 106 through a lens 104. It should be noted that the present embodiments are described with particular attention to spherical lenses, but it should be understood that those having ordinary skill in the art can adapt the present principles to any lens geometry that generates predictable interference patterns. A spherical lens 104 will produce an interference pattern known as Newton's rings.

The interference patterns are created by two or more independent beams of light. A first laser 108 and a second laser 110 create beams of light at different respective wavelengths. The beams of light are put into line with the lens 104 through a series of mirrors and half-silvered mirrors 112, 114, and 116. It should be recognized that those having ordinary skill in the art will be able to design a specific mirror arrangement appropriate to their needs. It is specifically contemplated that the first mirror 112 may be fully silvered, that the second mirror 114 may be a dichroic beam combiner, and that the third mirror 116 may be half-silvered. Whatever the arrangement of optics, the beam of the first laser 108 and the beam of the second laser 110 should overlap in space and should emerge from the same point on the surface of the lens 104 to ensure that the distance measured by each beam is the same.

It should be understood that although only two lasers are depicted, any number of lasers and any number of respective laser wavelengths may be employed, with the maximum distance that the system can detect increasing with each additional wavelength. In addition, although lasers are specifically contemplated any means of generating a collimated beam of monochromatic light may be used instead.

Figure 2:
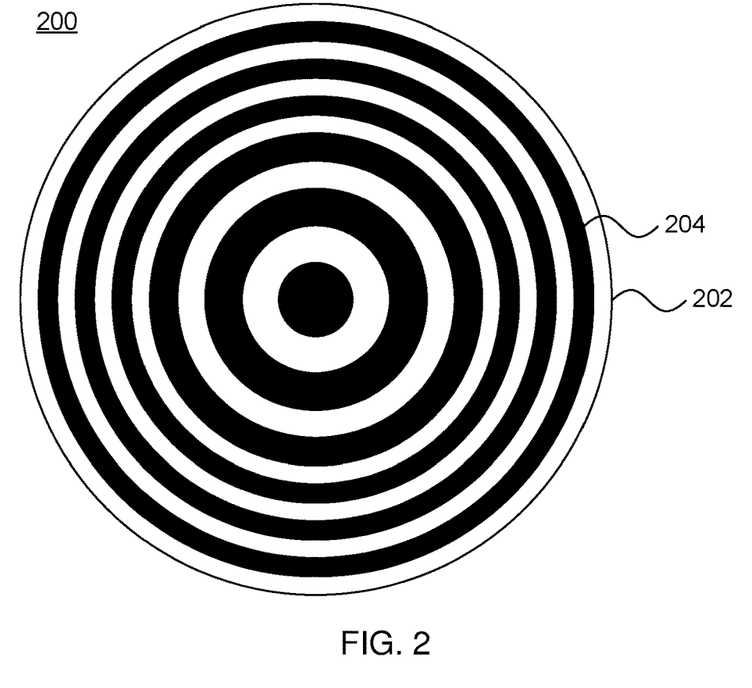
FIG. 2 is a diagram of an interference pattern in accordance with the present principles.

Referring now to FIG. 2, an example of an interference pattern 200 is shown. The interference pattern 202 is formed from light rings 202 interspersed by dark regions 204. The interference pattern 200 is an approximation of Newton's rings, which result from reflections between a flat surface and a spherical surface. Notably, the intensity peak of every light ring 202 has a position that is proportional to the radius squared. As the distance h between the lens 104 and the target surface 106 changes, the position of the $m^{th}$ ring 202 changes according to:

$$x_m^2 = p_1^2\left(m + \frac{1}{2}\right) - \frac{2n_0 h}{\lambda_1}$$

where $p_1^2$ is the spacing between the rings measured according to their radii squared, $\lambda_1$ is the wavelength of the incident light, and $n_0$ is the index of refraction of the medium between the lens 104 and the target surface 106, which may, for example, be air, vacuum, or a liquid such as water. In the example of air and vacuum, $n_0=1$. Thus the measured distance h can be determined using a single wavelength of light as:

$$h = \frac{\lambda_1}{2n_0}\left(m + \frac{1}{2} + \frac{x_m^2}{p_1^2}\right)$$

However, when recording the ring pattern, there is no way to determine the index m of a given peak. As the height increases, each rings moves outward and eventually a new ring appears at the center of the pattern. As a result, the interference pattern is periodic as the height increases, and it is impossible to know with certainty which ring is which in a measured interference pattern. This can be seen by considering the position of the first measurable peak $x_0^2$ in the interference pattern (e.g., the ring having the smallest radius), divided by the period $p_1^2$ (noting that peak period can be readily measured from an interference pattern), $r_1$, which will be in a range from zero to one. If $r_1$ corresponds to m=0, then:

$$h = \frac{\lambda_1}{2n_0}\left(\frac{1}{2} - r_1\right)$$

However, if $f_1$ corresponds to m=1, then:

$$h = \frac{\lambda_1}{2n_0}\left(\frac{3}{2} - r_1\right)$$

Thus, by measuring $r_1$, h can only be determined relative to some multiple of $$\frac{\lambda_1}{2n_0},$$

namely:

$$h = \frac{\lambda_1}{2n_0}\left(N + \frac{1}{2} - r_1\right)$$

where N is an integer. So, while measuring changes with a single wavelength is straightforward, the absolute distance is difficult to determine. For example, using an exemplary red wavelength of 632 nm, the period of the interference pattern will be $\lambda/2n$, or every 316 nm of height, for the first ring.

The present embodiments therefore employ two (or more) wavelengths that are not multiples of one another. By measuring multiple interference patterns that are not simple harmonics of one another, the effective period of the distance measurement is increased dramatically. In particular, each interference pattern gives an independent measurement of the same height:

$$h = \frac{\lambda_1}{2n_0}\left(N + \frac{1}{2} - r_1\right) = \frac{\lambda_2}{2n_0}\left(M + \frac{1}{2} - r_2\right)$$

with $\lambda_1$ and $\lambda_2$ referring to the wavelengths of the first laser 108 and the second laser 110 respectively, and with $r_1$ and $r_2$ representing the ratios of ring position to period for the respective first and second interference patterns. Because the wavelengths are not harmonics of one another, the number of pairs that solve the equation is small, though it should be noted that measurement limits in detection equipment impose practical limits as will be discussed in more detail below.

The above equation essentially finds values of N and M where both interference patterns provide the same h value. As long as the value of h is known to be within some maximum distance (e.g., within 100 microns of the surface 106), only one pair of (N, M) will solve the equation. In practice, all pairs within a certain range (e.g., that correspond to heights less than 100 microns) are searched and the pair that most closely solves the equation is selected. Once N and M are determined, the value of h is readily found simply by evaluating the equation for h according to one or both of N and M. This formulation can be extended to any number of wavelengths by solving the equation for additional indices.

In one exemplary embodiment, two lasers are used having respective wavelengths of about 632.8 nm and about 450 nm, with respective individual measurement periods of about 316.4 nm and about 225 nm. The resulting period of the measurement considering both interference patterns is much higher than the period of either measurement and can be increased even further by using additional wavelengths.

In general, the ability to determine the absolute height depends on the accuracy with which $r_1$ and $r_2$ are measured. As the height is varied, $r_1$ and $r_2$ will vary in a linear manner over a certain range of height, $\Delta h$. Specifically, $r_1 = mr_2 + b$. The y-intercept, b, determines the height range, $\Delta h$. In one exemplary embodiment, two lasers are used having respective wavelengths of about 632.8 nm and about 450 nm for height measurements in air. A measurement accuracy for b of about 1% enables an accurate determination of the height within about 70 μm of the surface with about 10 nm resolution.

Figure 3:
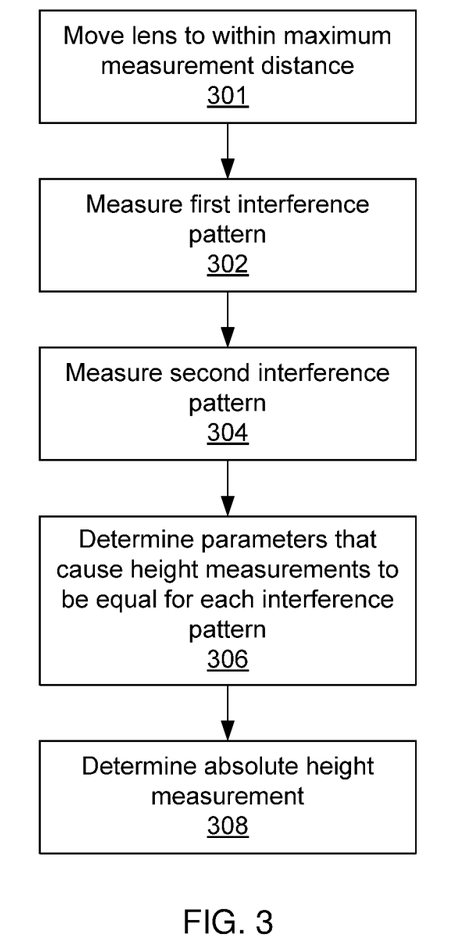
FIG. 3 is a block/flow diagram of a method of determining an absolute distance measurement in accordance with the present principles.

Referring now to FIG. 3, a method for determining an absolute height measurement is shown. Block 301 moves the lens 104 to within a maximum measurement distance from the target surface 106. This maximum measurement distance is determined by the periodicity of the combined-wavelength measurement system. Block 301 can be performed manually, with conventional measurement tools such as a micrometer. Block 302 then measures the first interference pattern using the first laser 108 to illuminate the target surface 106 through the lens 104, capturing the resulting interference rings using camera 102. Block 304 measures the second interference pattern in the same way. It should be noted that any number of additional wavelengths and measurements may be performed.

Block 306 then determines the parameters (e.g., N and M) that cause height measurements for each of the interference patterns to be equal. Using these parameters, an absolute distance measurement between the lens 104 and the target surface 106 is determined by block 308.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 4:
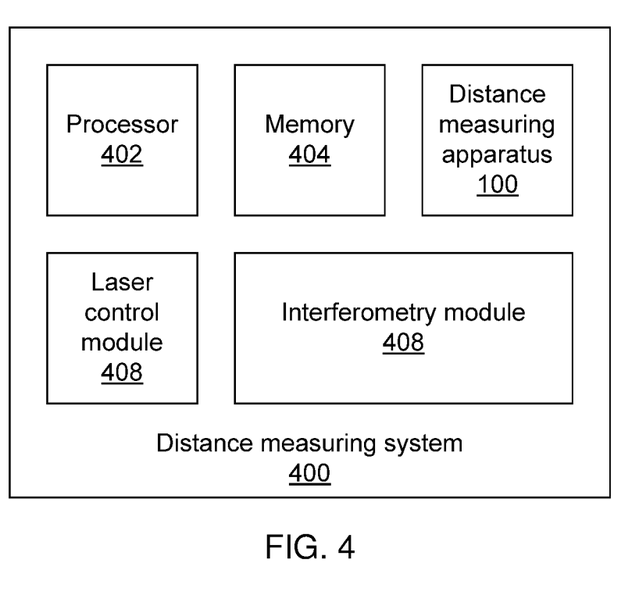
FIG. 4 is a block diagram of a distance measuring system in accordance with the present principles.

Referring now to FIG. 4, a distance measurement system 400 is shown. The system 400 includes a hardware processor 402 and memory 404. The system 400 also includes distance measuring apparatus 100, which uses lasers 108 and 110 and lens 104 to generate interference patterns that are captured by camera 106. The system 400 also includes functional modules that may, in one exemplary embodiment, be implemented as software that is stored in memory 404 and executed by processor 402.

For example, laser control module 408 interfaces with the lasers 108 and 110 (and any other lasers being used) and causes them to illuminate the target surface 106 through the lens 104. The laser control module 408 is capable of engaging one laser at a time, or alternatively engages all lasers at once if the camera 102 is capable of discriminating between them. Interferometry module 408 collects the interference patterns from the distance measuring apparatus 100 and uses them to determine the distance between the lens 104 and the target surface 106.

Figure 5:
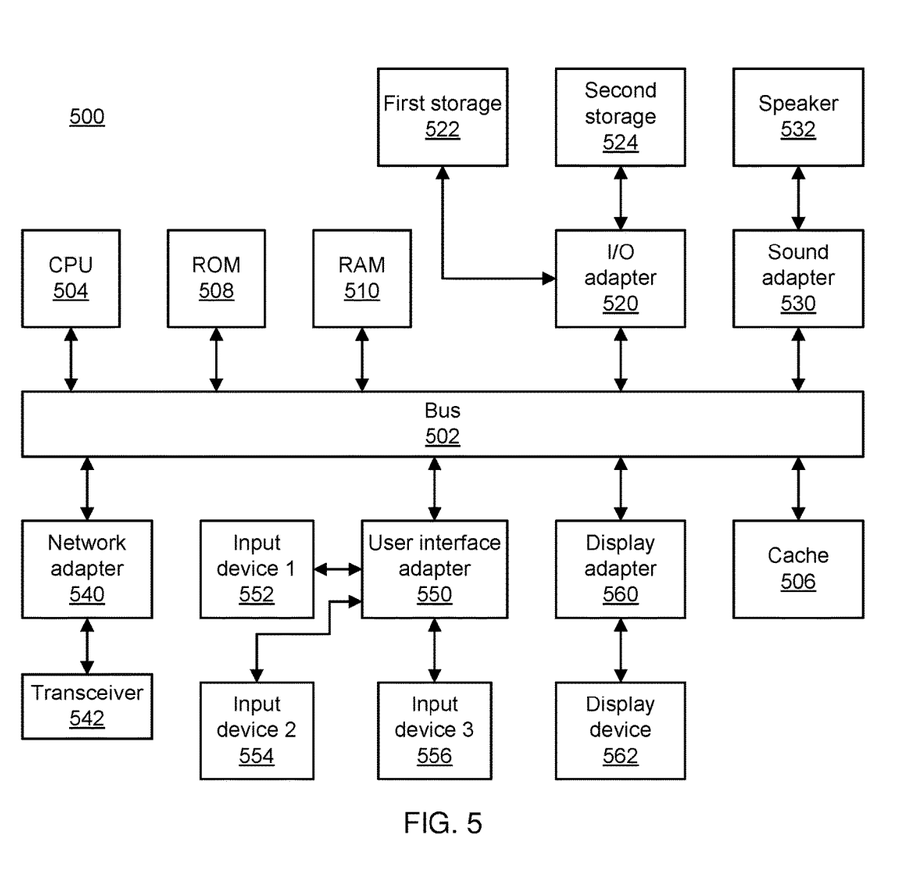
FIG. 5 is a block diagram of a processing system in accordance with the present principles.

Referring now to FIG. 5, an exemplary processing system 500 is shown which may represent distance measuring system 400. The processing system 500 includes at least one processor (CPU) 504 operatively coupled to other components via a system bus 502. A cache 506, a Read Only Memory (ROM) 508, a Random Access Memory (RAM) 510, an input/output (I/O) adapter 520, a sound adapter 530, a network adapter 540, a user interface adapter 550, and a display adapter 560, are operatively coupled to the system bus 502.

A first storage device 522 and a second storage device 524 are operatively coupled to system bus 502 by the I/O adapter 520. The storage devices 522 and 524 can be any of a disk storage device (e.g., a magnetic or optical disk storage device), a solid state magnetic device, and so forth. The storage devices 522 and 524 can be the same type of storage device or different types of storage devices.

A speaker 532 is operatively coupled to system bus 502 by the sound adapter 530. A transceiver 542 is operatively coupled to system bus 502 by network adapter 540. A display device 562 is operatively coupled to system bus 502 by display adapter 560.

A first user input device 552, a second user input device 554, and a third user input device 556 are operatively coupled to system bus 502 by user interface adapter 550. The user input devices 552, 554, and 556 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 552, 554, and 556 can be the same type of user input device or different types of user input devices. The user input devices 552, 554, and 556 are used to input and output information to and from system 500.

Of course, the processing system 500 may also include other elements (not shown), as readily contemplated by one of skill in the art, as well as omit certain elements. For example, various other input devices and/or output devices can be included in processing system 500, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 500 are readily contemplated by one of ordinary skill in the art given the teachings of the present principles provided herein.

Having described preferred embodiments of height measurement using optical interference (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A system for measuring a distance, comprising:
a lens positioned a distance above a target surface;
a camera configured to measure a first interference pattern between a reflection from the lens and a reflection from the target surface using a light source at a first wavelength and to measure a second interference pattern between a reflection from the lens and a reflection from the target surface using a light source at a second wavelength;
a processor configured to determine an absolute measurement of the distance between the lens and the target surface based on the first interference pattern and the second interference pattern.

2. The system of claim 1, wherein the first and second wavelength are not integer multiples of one another.

3. The system of claim 1, wherein the lens is a spherical lens and the first and second interference patterns are in the form of Newton's rings.

4. The system of claim 1, wherein the lens is positioned within a maximum measurement distance from the target surface.

5. The system of claim 1, wherein light source at the first wavelength and the light source at the second wavelength are both lasers.

6. The system of claim 1, wherein the distance between the lens and the target surface is limited to be within a maximum measurement distance.

7. The system of claim 1, further comprising a transmission medium between the lens and the target surface that is formed from one of air, water, and vacuum.

8. The system of claim 1, wherein the camera is further configured to measure a radius of a smallest ring in the first interference pattern and a radius of a smallest ring in the second interference pattern.

9. The system of claim 8, wherein the processor is further configured to determine an absolute measurement of the distance between the lens and the target surface based on the radius of the smallest ring in the first interference pattern and the radius of the smallest ring in the second interference pattern.

10. A system for measuring a distance, comprising:
a lens positioned a distance above a target surface;
a camera configured to measure a first interference pattern between a reflection from the lens and a reflection from the target surface using a light source at a first wavelength and to measure a second interference pattern between a reflection from the lens and a reflection from the target surface using a light source at a second wavelength, different from the first wavelength, by measuring a radius of a smallest ring in the second interference pattern;
a processor configured to determine an absolute measurement of the distance between the lens and the target surface based on the first interference pattern and the second interference pattern.

11. The system of claim 10, wherein the first and second wavelength are not integer multiples of one another.

12. The system of claim 10, wherein the lens is a spherical lens and the first and second interference patterns are in the form of Newton's rings.

13. The system of claim 10, wherein the lens is positioned within a maximum measurement distance from the target surface.

14. The system of claim 10, wherein light source at the first wavelength and the light source at the second wavelength are both lasers.

15. The system of claim 10, wherein the distance between the lens and the target surface is limited to be within a maximum measurement distance.

16. The system of claim 10, further comprising a transmission medium between the lens and the target surface that is formed from one of air, water, and vacuum.

17. The system of claim 10, wherein the camera is further configured to measure a radius of a smallest ring in the first interference pattern.

18. The system of claim 17, wherein the processor is further configured to determine an absolute measurement of the distance between the lens and the target surface based on the radius of the smallest ring in the first interference pattern and the radius of the smallest ring in the second interference pattern.

19. A system for measuring a distance, comprising:
a spherical lens positioned a distance, within a maximum measurement distance, above a target surface;
a camera configured to measure a first interference pattern between a reflection from the spherical lens and a reflection from the target surface using a laser at a first wavelength, by measuring a radius of a smallest ring in the first interference pattern, and to measure a second interference pattern between a reflection from the spherical lens and a reflection from the target surface using a laser at a second wavelength, different from the first wavelength, by measuring a radius of a smallest ring in the second interference pattern;
a processor configured to determine an absolute measurement of the distance between the spherical lens and the target surface based on the radius of the smallest ring of the first interference pattern and the radius of the smallest ring of the second interference pattern.

20. The system of claim 19, further comprising a transmission medium between the spherical lens and the target surface that is formed from one of air, water, and vacuum.

* * * * *